United States Patent

Kao et al.

[11] Patent Number: 5,963,818
[45] Date of Patent: Oct. 5, 1999

[54] COMBINED TRENCH ISOLATION AND INLAID PROCESS FOR INTEGRATED CIRCUIT FORMATION

[75] Inventors: Soolin Kao; Sergio A. Ajuria; Diann M. Dow; Susan E. Soggs, all of Austin, Tex.

[73] Assignee: Motorola, Inc, Schaumburg, Ill.

[21] Appl. No.: 08/932,398

[22] Filed: Sep. 17, 1997

[51] Int. Cl.⁶ .................................................. H01L 21/76
[52] U.S. Cl. .......................... 438/424; 438/221; 257/330
[58] Field of Search ..................... 438/221, 424; 257/330

[56] References Cited

U.S. PATENT DOCUMENTS

| | | | |
|---|---|---|---|
| 5,434,093 | 7/1995 | Chau et al. | 437/41 |
| 5,728,621 | 3/1998 | Zheng et al. | 438/427 |
| 5,795,811 | 8/1998 | Kim et al. | 438/404 |
| 5,866,465 | 2/1999 | Doan et al. | 438/424 |

*Primary Examiner*—Charles Bowers
*Assistant Examiner*—David S Blum
*Attorney, Agent, or Firm*—Keith E. Witek

[57] ABSTRACT

A method for forming an integrated circuit involves forming trench isolation regions (208a) and a damascene gate electrode region (214) simultaneous with one another via overlapping process steps. By performing this simultaneous formation of a trench region (208a) and a damascene gate electrode (214) using a common dielectric layer (208), MOS integrated circuits can be formed with reduced processing steps while simultaneously avoiding adverse polysilicon stringers which are present in prior art damacene-formed gate electrode. A single dielectric layer (208) is deposited in order to provide trench fill material for a trench region (208a) while simultaneously providing the material needed for form an opening (210) which is used to define the dimensions and material content of a gate electrode (214).

23 Claims, 6 Drawing Sheets

COMBINED TRENCH ISOLATION AND INLAID PROCESS FOR INTEGRATED CIRCUIT FORMATION

FIELD OF THE INVENTION

The present invention relates generally to semiconductor manufacturing, and more particularly to a combined process for simultaneously forming trench isolation and a polysilicon MOS gate electrode.

BACKGROUND OF THE INVENTION

In the integrated circuit (IC) industry, semiconductor devices are being manufactured to contain metal oxide semiconductor (MOS) transistors which have conductive gate electrodes formed from a damascene process. This damascene process requires that gate electrode openings be formed first in a dielectric layer. After the opening is formed, the opening is filled with a deposited conductive material where chemical mechanical polishing (CMP) of the conductive material is used to confine the conductive material to the opening, and only the opening. In reality, this damascene polishing process of the conductive material may form conductive stringers in areas of the IC where conductive material is not desired. These conductive stringers are adverse to device performance and integrated circuit (IC) yield. In the prior art, when trench isolation is used along with damascene gate electrodes, the number of processing steps and mask sequences which have been performed in order to manufacture an integrated circuit significantly increases. It is therefore desirable for the integrated circuit industry to develop a process which removes or reduces the disadvantages associated with unwanted conductive stringers and/or reduces the number of processing used to form trench isolation in conjunction with damascene MOS gate electrodes. FIGS. 1–4 are used to illustrate the prior art problems encountered when attempting to form trench isolation in conjunction with damascene gate electrodes on the same IC substrate.

FIG. 1 illustrates a prior art device 10. Device 10 contains a silicon substrate 20. Trench regions are etched into the substrate using conventional lithographic masking and plasma etching. These trench regions are filled with a dielectric material and chemically mechanically polished (CMP) to form trench isolation regions 26 in FIG. 1. After formation of the trench regions 26, P-wells 22 and N-wells 24 are formed within the substrate 20. The formation of the trench regions and the N-well and P-well regions in isolation from any MOS structures incurs a significant number of masking and process steps without even forming a single active structure useful for MOS operation. In other words, all of the trench isolation processing of the prior art is performed separate from and before any MOS processing (e.g., gate oxide formation, gate electrode patterning, source and drain implantation, etc.). In addition, early formation of the trench region results in CMP dishing of the trench region 26 as illustrated in FIG. 1 wherein a recess region is formed along a top portion of the trench region 26.

After several masking and processing steps are incurred to form the trench regions 26 and the well regions 22 and 24, MOS transistor processing begins. In FIG. 1, a gate dielectric layer 28 is formed after trench isolation processing is complete. A polysilicon layer 30a is deposited over the top of the dielectric 28 and the trench regions 26. An anti-reflective coating (ARC) 32 such as silicon-rich silicon nitride is formed overlying the polysilicon layer 30a in FIG. 1. Notice that the polysilicon layer 30a and the ARC layer 32 are highly conformal layers which follow the trench contour and therefore have recessed regions that follow the recess region in the trench region 26. After formation of the polysilicon layer 30a and the ARC layer 32, a thick dielectric layer 34 is formed. Notice that portions of the layer 34 which overlie the trench region are also conformal and contain recesses above the trench region 26.

The layer 34 is coated with a photoresist layer (not shown in FIG. 1) which is lithographically processed and etched in order to form openings. These openings are filled with nitride spacers 36 and polysilicon plug regions 38a. The nitride spacers 36 are formed by depositing silicon nitride and reactive ion etching (RIE) the silicon nitride to form the nitride spacers 36. The polysilicon plug region 38a is formed by depositing a conformal layer of polysilicon and chemical mechanical polishing (CMP) the polysilicon layer to form the desired polysilicon gate electrode plug 38a. However, due to the recesses in the layer 34 which overlie the trench regions 26, inadvertent polysilicon stringers 38b formed in unwanted areas of the semiconductor device as shown in FIG. 1.

FIG. 2 illustrates that these polysilicon stringers 38b from FIG. 1 can be problematic during subsequent IC processing. FIG. 2 illustrates that an oxide etch is used to remove the layer 34 to enable source and drain implants and enable formation of electrical contacts to the subsequently-formed MOS source and drain regions. Since the polysilicon stringers 38b are present on a top portion of the dielectric layer 34, the dielectric layer 34 may not be entirely removed by the oxide etch step whereby some portions of layer 34 may remain over the trench regions 26. Portions of the polysilicon layer 30a are then removed in order to provide access to source and drain regions which are subsequently formed in the substrate in the self-aligned manner to the gate plug 38a. However, this polysilicon reactive ion etch (RIE) will not enable effective removal of all of the layer 38a which overlies the trench regions 26 whereby polysilicon stringers 30b will form due to the presence of the remaining stringer portions 34 in FIG. 2. These polysilicon stringers 30b are formed due to the masking effect created by the remaining portions of the layer 34 in FIG. 2 whereby the polysilicon etch cannot penetrate the oxide portions 34 and effectively remove the polysilicon stringers 30b.

The polysilicon stringers 30b in FIG. 2 are disadvantageous since the stringers 30b may cause electrical shorts between IC devices or may add capacitance within MOS transistor devices. It would be advantageous to the IC industry to develop a process which can effectively avoid the formation of the stringers 30b or reduce the effects of the formation of these polysilicon stringers 30b.

FIGS. 3 and 4 illustrate a process complexity problem which occurs when trench processing is used in conjunction with damascene gate electrode processing. This process complexity issue is in addition to the polysilicon stringer problem illustrated in FIGS. 1 and 2 herein. FIG. 3 illustrates that many lithographic, etch steps, deposition steps, etc., are needed to form a trench isolation region in the substrate. FIG. 3 illustrates a device 12 which has a substrate 40. FIG. 12 illustrates that a pad oxide 42 is grown on a substrate 40. A silicon nitride layer 44 is formed on top of the pad oxide 42. A photolithographic and etch process is used to etch an opening through the layer 44, through the layer 42, and into the trench 40 as illustrated in FIG. 3.

After formation of the opening in FIG. 3, a thick dielectric layer, such as an ozone-tetraethylorthosilicate ($O_3$-TEOS) layer, is deposited to form regions 48 of FIG. 3. FIG. 3 specifically illustrates three different types of regions for the layer 48. Region 48a of FIG. 3 is a portion of the O$_3$-TEOS layer which fills the trench opening and should remain in the final IC device. Portion 48b of the O$_3$-TEOS layer in FIG. 3 is a portion of material which overlies the trench fill but should be subsequently removed by chemical mechanical polishing (CMP). Region 48c is a portion of the O$_3$-TEOS layer which is removed by a reactive ion etch (RIE) processing prior to polishing of region 48b. Region 38c is RIE etched without etching regions 48a and 48b by using a photoresist mask layer 50 in FIG. 3. Therefore, a dielectric trench plug region comprising material 48a is formed by depositing and developing the photoresist mask 50 and reactive ion etching (RIE) portions 48c of the O$_3$-TEOS layer to leave behind only regions 48a and 48b of the O$_3$-TEOS layer. The photoresist layer 50 is then removed and the chemical mechanical polishing (CMP) process is utilized to remove the region 48b whereby the layer 48a remains as a dielectric trench fill region. Therefore, FIG. 3 illustrates that many processing steps are needed in order to form a trench dielectric region before conventional MOS processing can even begin using prior art techniques.

FIG. 4 illustrates that multiple processing steps, in addition to the trench processing steps of FIG. 3, are then subsequently performed in order to form MOS devices in active areas of the substrate 40. FIG. 4 specifically illustrates that a gate oxide 52 is formed after formation of the trench region 48a. A polysilicon layer 52 is formed and this polysilicon layer 52 is capped with an antireflective coating (ARC) 56. A thick furnace TEOS layer 58 is deposited and etched in order to form damascene gate electrode openings as illustrated in FIG. 4. Silicon nitride deposition and etch processing is then utlized to form spacers 60 and a polysilicon layer 62 is formed. The polysilicon layer 62 in FIG. 4 is segmented into two portions 62a and 62b. The portion 62a is to be subsequently removed by damascene chemical mechanical polishing (CMP) whereby the layer 62b is to be left behind after chemical mechanical polishing to form a damascene gate electrode plug region.

As can be seen from FIGS. 3 and 4, a significant amount of photolithographic, deposition, and etch processing is needed in order to form a trench isolation region in a serial manner with MOS transistor damascene structures. It would be advantageous in the IC industry to develop a process whereby trench isolation and MOS damascene gate electrode processing could be formed using fewer processing steps while also avoiding the stringer problems of FIGS. 1-2.

DETAILED DESCRIPTION OF THE PRESENT INVENTION

Generally, the present invention is an improved method for manufacturing an integrated circuit (IC) having both trench isolation and MOS devices which contain damascene (i.e., "inlaid") processed gate electrode. All of the embodiments taught herein perform one or more of the following functions and/or have one or more of the following advantages over the prior art. The embodiments taught herein either reduce or entirely eliminate the polysilicon stringer problem discussed herein with respect to FIGS. 1 and 2. The process taught herein typically contains significantly fewer steps than the prior art of FIGS. 1–4 which forms trench isolation structures completely before beginning IC damascene MOS processing. Many of the processes taught herein simultaneously form trench isolation structures and damascene gate electrode regions using overlapping processing steps whereby many process steps can be reduced from conventional process flows. The process taught herein can be used with any trench isolation scheme, and generally eliminates the need to planarize the isolation prior to transistor formation. The trench re-oxidation or trench liner process taught herein rounds the trench corner and thickens the gate oxide along trench edges, thereby improving MOS field edge reliability.

Some of the processes taught herein, such as the process of FIGS. 8–13, results in gate oxide formation very early in the process flow (even before trench isolation structures are formed). In the process of FIGS. 8–13, the gate oxide layer is the first layer formed on the substrate wherein the substrate is not adversely effected by IC processing before the gate oxide is formed. Therefore, the devices resulting from this process will have reduced gate oxide defectivity which is an improvement over post-trench formed gate dielectric. Furthermore, many of the processes taught herein form trench isolation regions in a first IC region in parallel or in conjunction with MOS processing in a second IC region. Not only does this improve yield and throughput, but subsequent MOS processing will not as significantly reduce, etch, or recess trench fill isolation material as is a problem in the prior art process. Many of the processes taught herein are compatible with graded channel MOS (GCMOS) processing and inherently provide nitride spacers along trench sidewalls of a lower polysilicon gate layer and exposed corners of trench isolation regions in order to avoid adverse short circuiting to the substrate.

Figure 5:
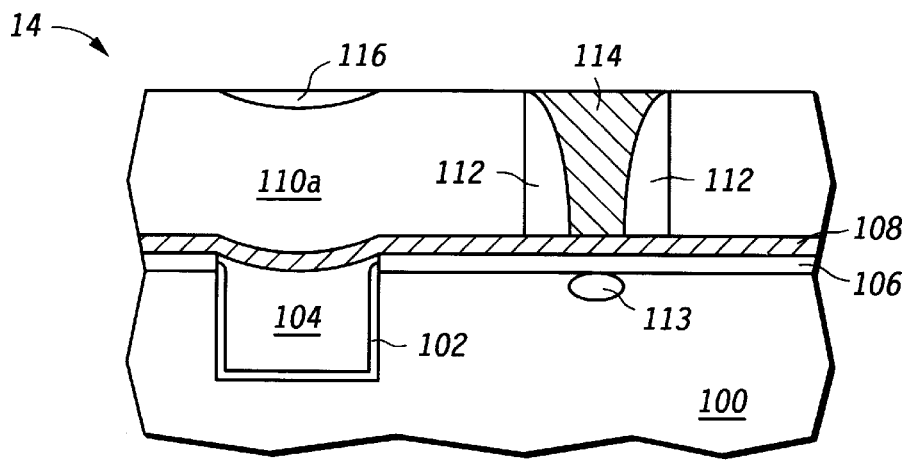
FIGS. 5–7 illustrate, in cross-sectional diagrams, a process which can be used to avoid the stringer problem previously illustrated in FIGS. 1-2 in accordance with the present invention.
Figure 6:
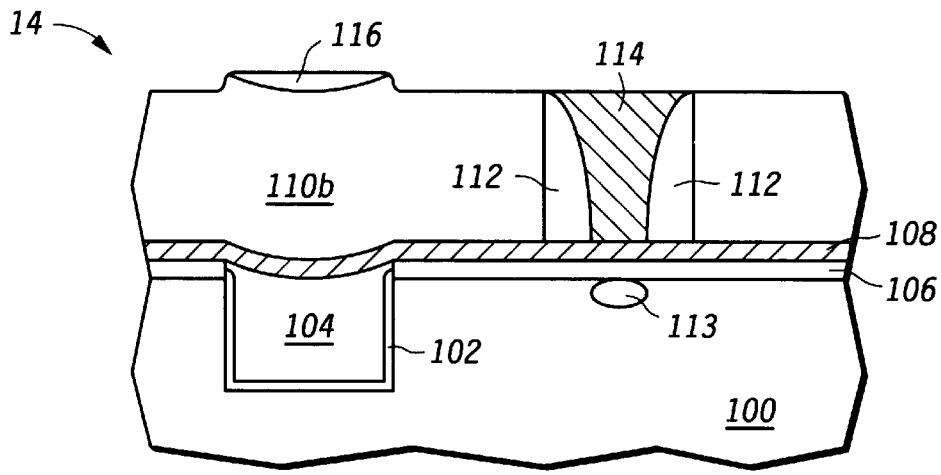
Figure 7:
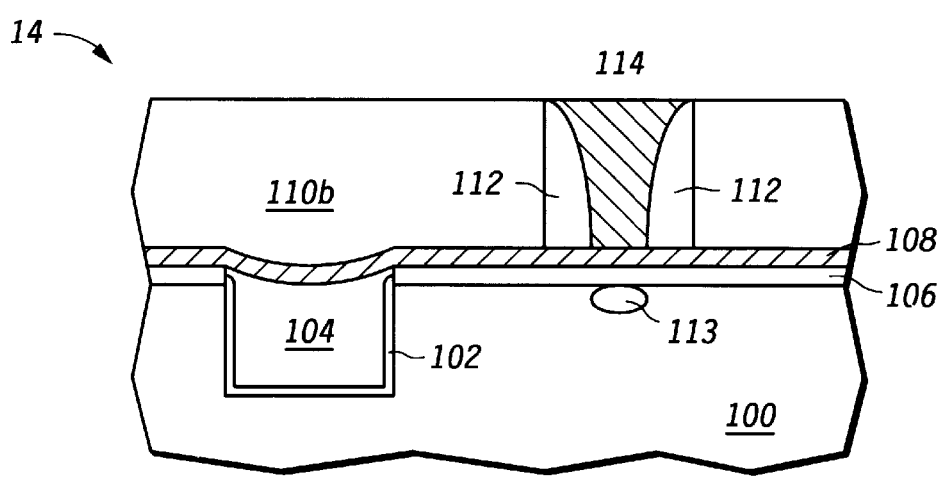

The invention can be further understood with reference to FIGS. 5–7 which disclose a first embodiment, FIGS. 8–13 which disclose a second embodiment, and FIGS. 14–17 which disclose a third embodiment.

Figure 1:
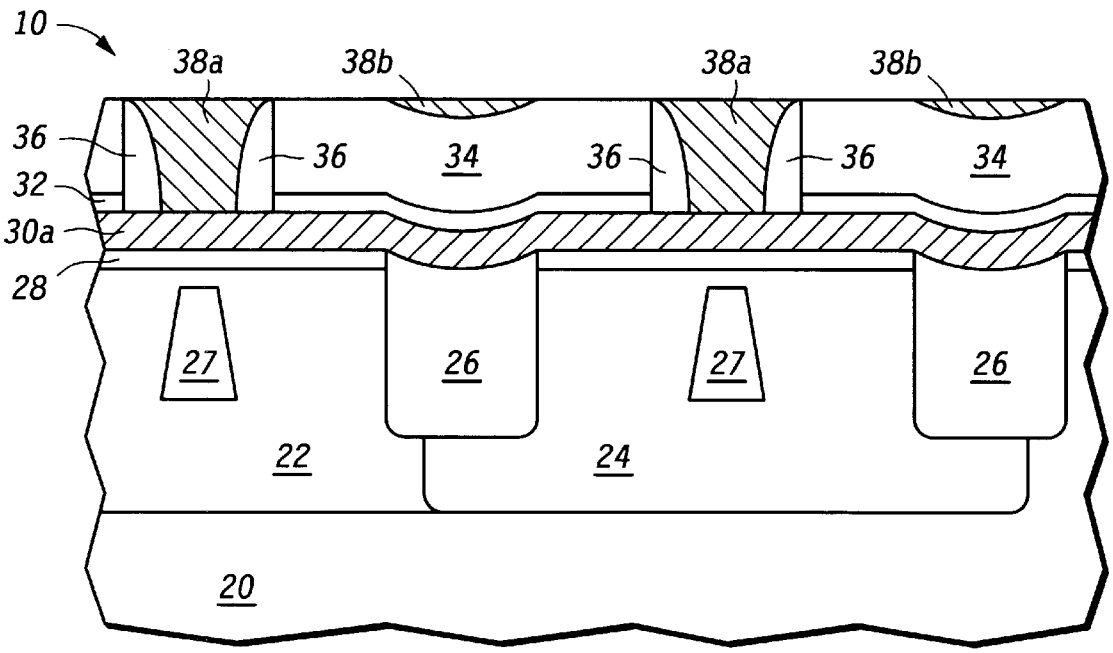
FIGS. 1 and 2 illustrate, in cross-sectional diagrams, a polysilicon stringer problem which occurs when making damascene gate electrode structures over pre-formed trench regions in the prior art.
Figure 2:
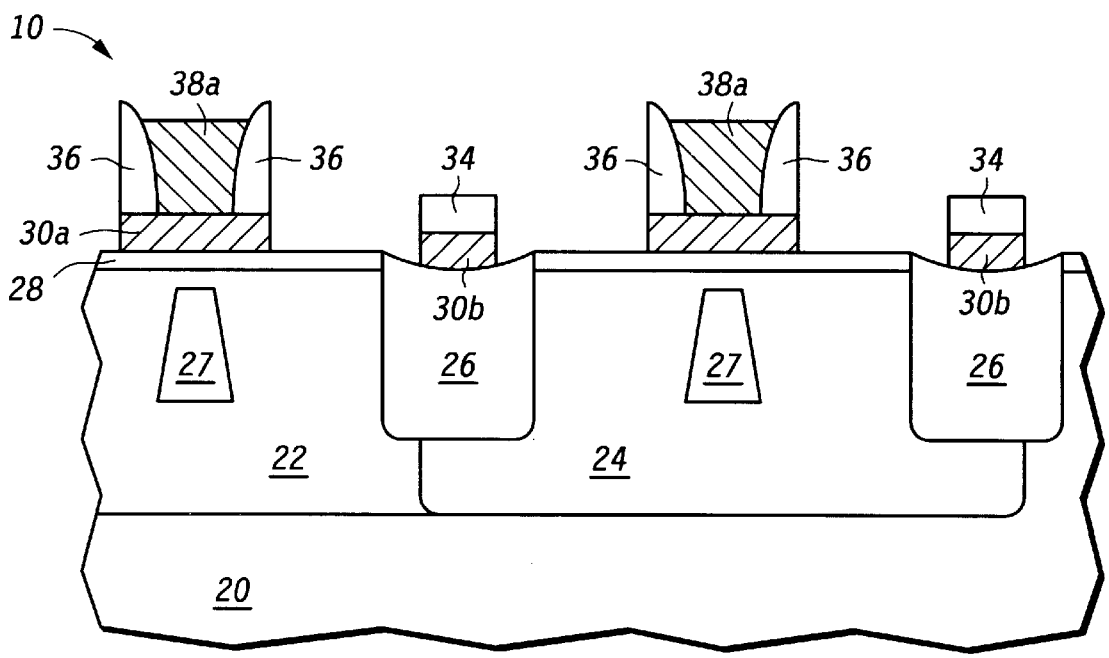
Figure 3:
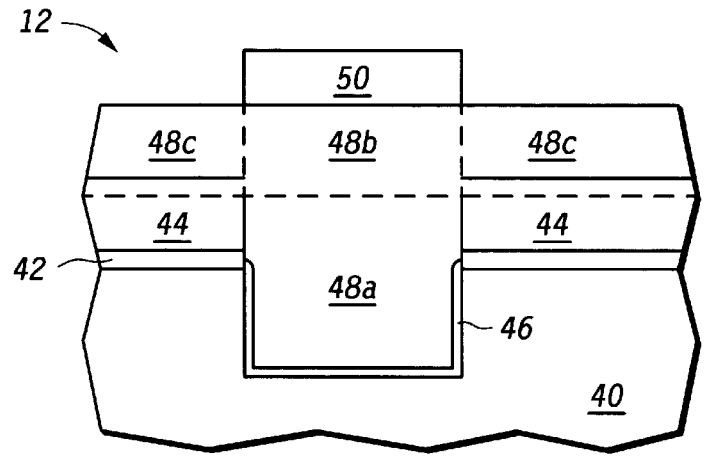
FIGS. 3-4 illustrate, in cross-sectional diagrams, the extreme number of IC processing steps which are needed to serially form a trench isolation structure followed by the serial formation of a damascene gate electrode in the prior art.
Figure 4:
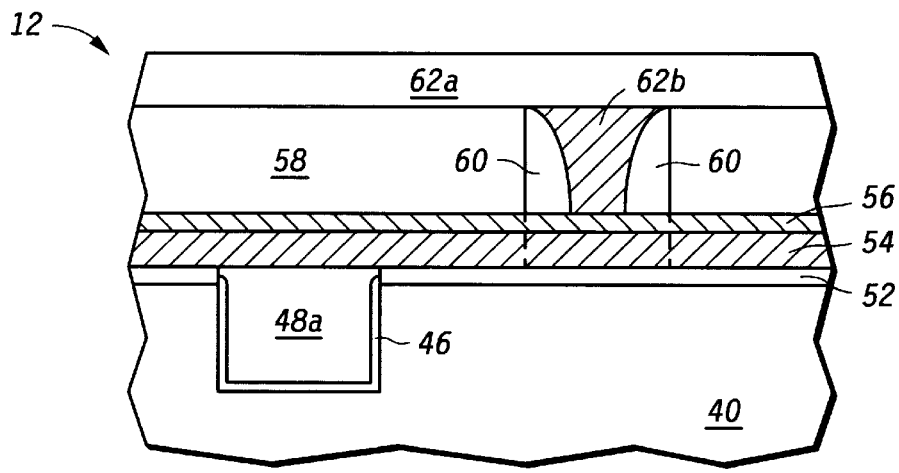

FIGS. 5–7 illustrate a first embodiment of the present invention whereby the polysilicon stringer problem illustrated in FIGS. 1-2 is avoided. While the embodiment of FIGS. 5–7 removes or reduces the polysilicon stringer problem of FIGS. 1 and 2, the embodiment of FIGS. 5–7 does not address the reduction in processing steps used to form trench isolation and damascene gate electrodes on the same substrate. This additional improvement will be subsequently discussed in the processing of FIGS. 8–17.

FIG. 5 illustrates a semiconductor device 14. Semiconductor device 14 contains a semiconductor substrate 100. The substrate 100 is preferably a silicon wafer but may be one or more of a silicon germanium substrate, a gallium arsenide substrate, a silicon-on-insulator (SOI) substrate, silicon carbide, epitaxial grown regions, wafer-bonded substrates, or a like substrate starting material. FIG. 5 illustrates that trench areas are lithographically patterned and etched into the substrate 100 through a pad oxide and nitride mask. A re-oxidation of the sidewall and bottom portion of the trench isolation opening is performed in order to form a dielectric liner 102 in FIG. 5. The liners taught herein which are used to line trench regions can be thermally grown oxides, deposited dielectrics, or a composite thereof. After formation of the liner 102, a thick dielectric layer such as $O_3$-TEOS and/or furnace TEOS is deposited and polished to form a dielectric plug region 104. The chemical mechanical polishing (CMP) process which is used to form the plug region 104 will dish the dielectric plug region 104 whereby the region 104 will have a slight recess with respect to the substrate.

After formation of dielectric trench region 104, optional N-well and P-well regions (not shown) can be formed within substrate 100 in order to enable subsequent CMOS or MOS device formation. After appropriate well processing, a gate oxide 106 is formed subsequent to an appropriate substrate preparation such as RCA cleaning. A first polysilicon layer 108 is then deposited overlying the gate dielectric 106 whereby the polysilicon layer 108 will protect the oxide 106 from subsequent processing steps. Note that the layer 106 and 108 are highly conformal layers which will also incorporate the recess region which was formed previously in trench region 104. After formation of the layer 108, a thick dielectric layer 110a is formed as illustrated in FIG. 5. Layer 110a is preferably a layer of furnace TEOS which is formed to a thickness of roughly 3,000 angstroms. The furnace TEOS layer 110a is also a highly conformal layer wherein the TEOS layer 110a will also have the recess region which was previously formed in the trench region 104.

FIG. 5 illustrates that lithographic and etch processing is used to form an opening in the layer 110a wherein a damascene gate electrode is to be formed. A conformal thin silicon nitride deposition is used followed by an RIE etch process in order to form silicon nitride spacers 112 in FIG. 5. A polysilicon layer and/or an amorphous silicon layer is deposited and polished in order to form a plug region 114 in FIG. 5. A composite of a portion of the layer 108 and the plug region 114 will be subsequently used to form a complete gate electrode for an MOS transistor formed within an active area of the substrate 100. It should be to noted that before formation of the polysilicon plug region 114 and either before or after the formation of the nitride spacers 112, various punch-through and threshold voltage (Vt) adjust implants can be performed into the substrate 100 to form one or more doped region of the substrate 113 in FIG. 5 to control MOS punch-through effects and Vt.

It should be noted that the chemical mechanical polish (CMP) process used to form the plug region 114 will also form a polysilicon defect region 116 within the recess region of the layer 110a due to the presence of the recess region in layer 110a. Therefore, the polysilicon chemical mechanical polishing (CMP) in FIG. 5 is generally not adequate to entirely remove the defect 116 from the device of FIG. 5.

FIG. 6 illustrates that the polysilicon CMP environment of FIG. 5 is changed to an oxide CMP environment in FIG. 6. For example, in one form, the polysilicon ammonia hydroxide CMP environment of FIG. 5 is changed to a potassium hydroxide CMP environment in FIG. 6 to effectively enable oxide recessing in an insitu manner in the same CMP processing tool. After being exposed for a period to the oxide polishing environment, FIG. 7 illustrates that a polysilicon polishing environment is once again changed. Since the oxide in FIG. 6 has been recessed from a layer 110a to a slightly thinner layer 110b, the polysilicon defect 116 will be more exposed to polishing environments in FIG. 7. Therefore, the polysilicon polish in FIG. 7 can now remove the polysilicon defect 116 in an effective manner. Therefore, FIGS. 5–7 illustrate that a polysilicon-oxide-polysilicon CMP process can be utilized in an insitu manner in order to reduce or entirely remove the polysilicon stringer problem illustrated in FIGS. 1 and 2 herein.

FIGS. 8–13 illustrate a process whereby the polysilicon stringer problem of FIGS. 1 and 2 is avoided and whereby a significant number of processing steps may be eliminated from a process flow while still enabling trench isolation formation along with the formation of a damascene gate electrode MOS structure.

Figure 8:
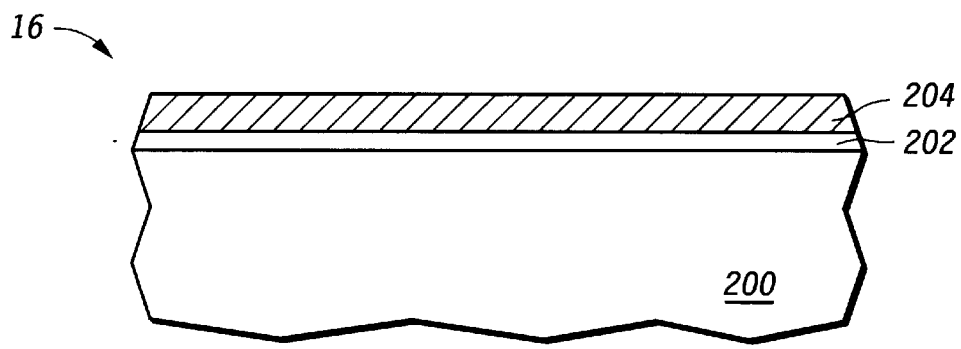
FIGS. 8–13 illustrate, in cross-sectional diagrams, an improved process which can be used to simultaneously form trench isolation regions and damascene gate electrodes in parallel whereby polysilicon stringer problems are avoided and an overall number of processing steps is reduced in accordance with the present invention.

FIG. 8 illustrates a device 16. Device 16 comprises a substrate 200 which is similar to the substrate 100 previously discussed with respect to FIGS. 5–7. A gate oxide layer 202 is formed over the substrate 200. Note that the gate oxide layer 202 will be the gate oxide which is subsequently used for active MOS devices formed over an active area of the substrate 200. Therefore, the process of FIGS. 8–13 differs from the prior art in that a gate oxide 202 is formed even before trench processing begins in FIG. 9. By doing so, the gate oxide 202 is formed on an unprocessed silicon substrate whereby sacrificial oxide processing and/or RCA deaning along with the early formation of the gate oxide should produce a superior gate oxide when compared to the prior art. It should be important to note that the gate dielectric 202 may be a thermally grown dielectric layer, a deposited dielectric layer, a combination thereof, a high-k dielectric material, or any like dielectric material. The layer 202 may also be exposed to nitridation and/or fluorination in order to form an improved gate oxide layer. FIG. 8 illustrates that the gate dielectric layer 202 is capped with a polysilicon layer 204. The layer 204 is a relatively thin layer of polysilicon which is roughly within the range of 300 angstroms to 700 angstroms in thickness.

Figure 9:
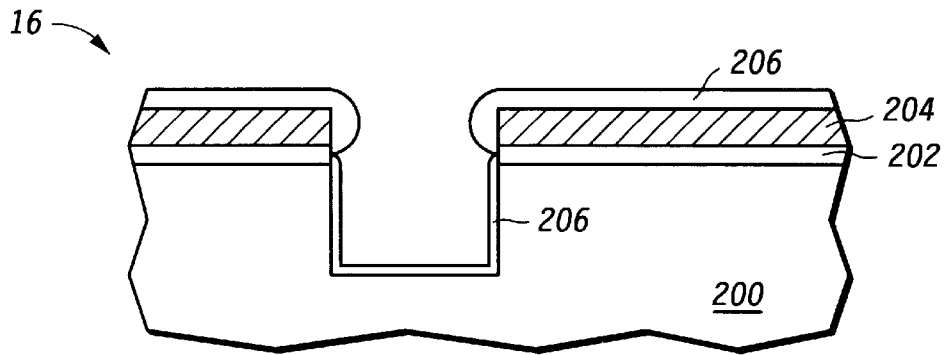

FIG. 9 illustrates that a photoresist layer (not shown) is deposited, exposed to light, and developed in order to form an opening. This opening exposes a portion of the layer 204. This exposed portion of the layer 204 is exposed to a polysilicon reactive ion etch (RIE) environment in order to form an opening through the layer 204 to expose a portion of the layer 202. A reactive ion etch (RIE) for oxide materials is then performed to deepen this trench region through layer 202 in FIG. 9 to expose the substrate 200. The opening is then trenched into the substrate 200 through use of the plasma silicon etch process. The result in FIG. 9 is that a trench isolation region is formed within the substrate 200 through the layers 202 and 204. A liner reoxidation is performed on the trench in order to form a thermal oxide 206 in FIG. 9. The reoxidation process will round upper sharp corners of the trench region in FIG. 9 whereby MOS edge performance is improved. The liner 206 can be formed by conventional means, such as a grown thermal oxide and/or a deposited dielectric layer which is optionally nitrided or fluorinated as needed.

Figure 10:
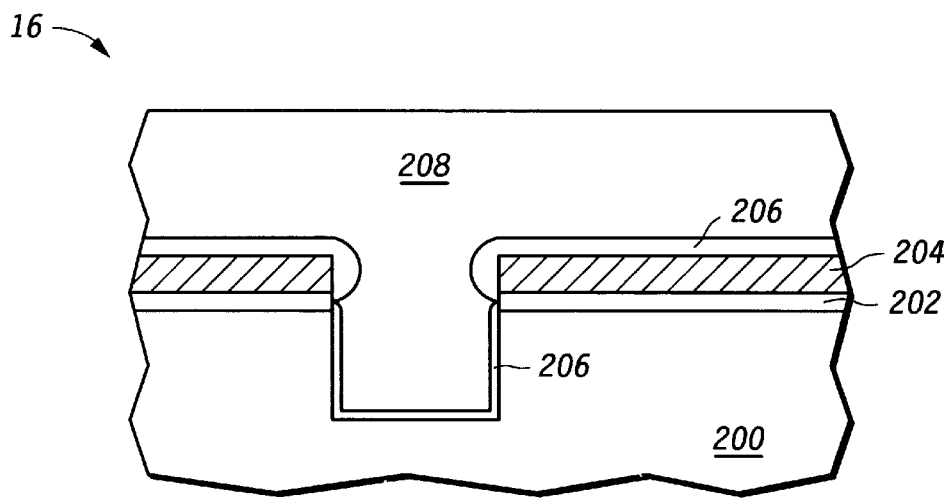

After reoxidation/liner processing in FIG. 9, a thick $O_3$ TEOS layer 208 is deposited as illustrated in FIG. 10. Both oxides 206 and 208 are shown in FIG. 10, but are combined as a single reference 208 in FIGS. 11 through 13. The layer 208 in FIG. 10 is deposited roughly in the range of 5,000–20,000 angstroms in initial thickness with 10,000 angstroms being roughly optimal. The layer 208 of FIG. 10 is partially chemically mechanically polished over the field region in order to reduce the thickness of this layer by up to roughly 70% to result in an effective final thickness of at least a few thousand angstroms for layer 208. This few thousand angstroms of O₃ TEOS should overlie the polysilicon layer 204 in FIG. 10 and fill the trench region within the substrate 200. By polishing the thick oxide 208, the recess of the prior art are avoided.

Figure 11:
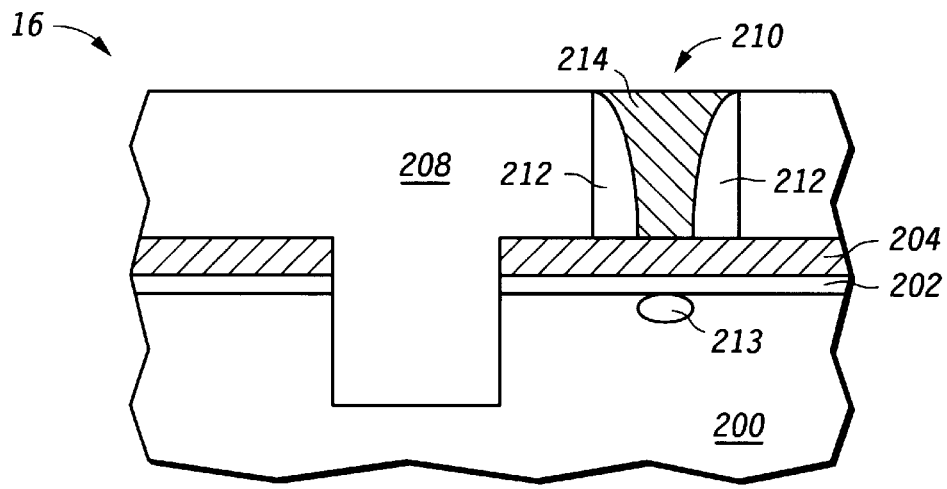

FIG. 11 illustrates that a photolithographic mask (not shown) is processed in order to enable reactive ion etching (RIE) of the layer 208 to form an opening 210. A silicon nitride deposition process and reactive ion etch (RIE) processing is performed in FIG. 11 in order to form nitride spacers 212 within the opening 210. A polysilicon layer and/or an amorphous polysilicon layer is deposited and chemical mechanically polished in order to form a polysilicon plug 214 in FIG. 11. This polysilicon layer may be doped with dopant atoms such as boron, phosphorus, or arsenic via insitu doping or via ion implantation and/or thermal diffusion. Notice no recess exists in the layer 208. Therefore, polysilicon stringers are avoided in the process of FIGS. 8–13 unlike the prior art of FIGS. 1-2. Notice that FIG. 11 also illustrates that the same layer 208, which is used to fill the trench region in FIG. 11, is also used to pattern a lithographic dimension of a gate electrode for a MOS transistor to form a region 214. This dual usage of the layer 308 saves a number of processing steps since the same steps are used to fill the trench isolation and create portions of the MOS transistor (such as gate electrode regions). Notice that the spacers 212 and/or the opening 210 enable punch-through implants, threshold voltage (Vt) adjust implants, and graded channel implants into the substrate in a self-aligned manner to form doped region(s) 213 in FIG. 11 prior to forming the gate electrode region 214.

Figure 12:
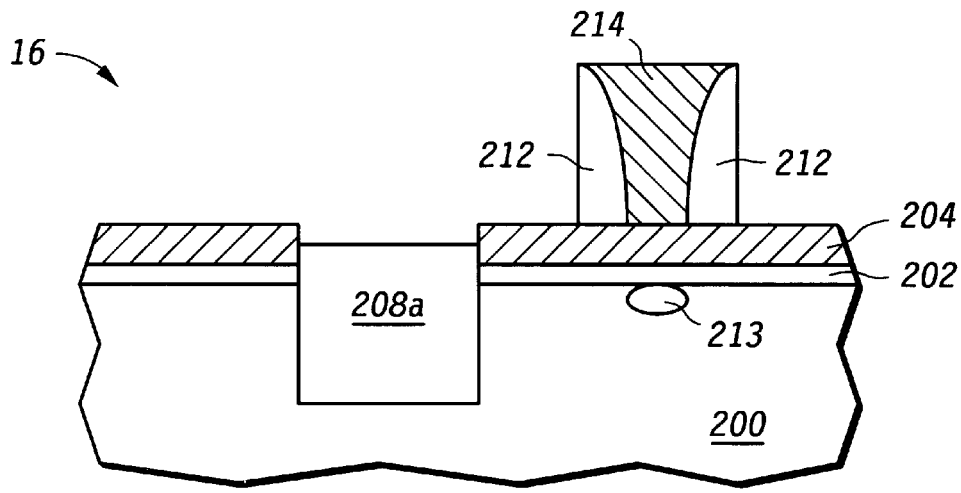

FIG. 12 illustrates that a reactive ion etch (RIE), other plasma etch, and/or a wet oxide etch is utilized to recess the layer 208 in order to form trench fill region 208a composed of an O₃ TEOS or like material after polysilicon gate electrode formations 214 and 204 are in place. This recessing of the layer 208 is performed selective to the nitride spacers 212 and to the polysilicon regions 214 and 204. Notice that the polysilicon layer 204 not only functions as a portion of the final MOS gate electrode, but the polysilicon layer 204 protects the critical portions of the gate dielectric layer 202 from damaging etch processes used to form the opening 210, the spacers 212, and the trench fill 208a.

Figure 13:
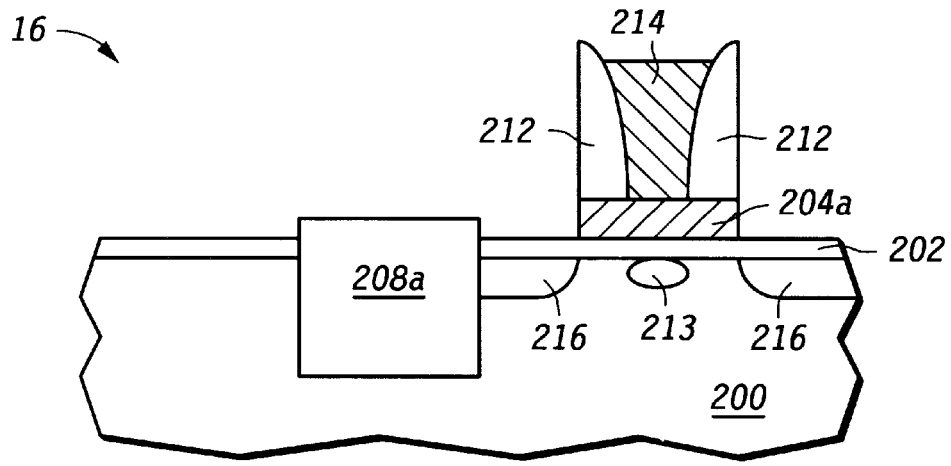

After recessing of the layer 208, FIG. 13 illustrates that a polysilicon etch is utilized to slightly recess the polysilicon region 214 and to remove portions of the layer 204 over source and drain active areas of the substrate 200. The removal of the portions of layer 204 leaves behind a layer 204a in FIG. 13 whereby the composite of the polysilicon and/or amorphous silicon regions 204a and 214 form a collective gate electrode for an MOS transistor device. Notice that the gate dielectric region 202 which was first formed in FIG. 8 is the gate dielectric used in FIG. 13 for the MOS structure. Notice that the process of FIGS. 8–13 has most, if not all, of the advantages which were discussed above in the overview of the three embodiments disclosed herein.

Figure 14:
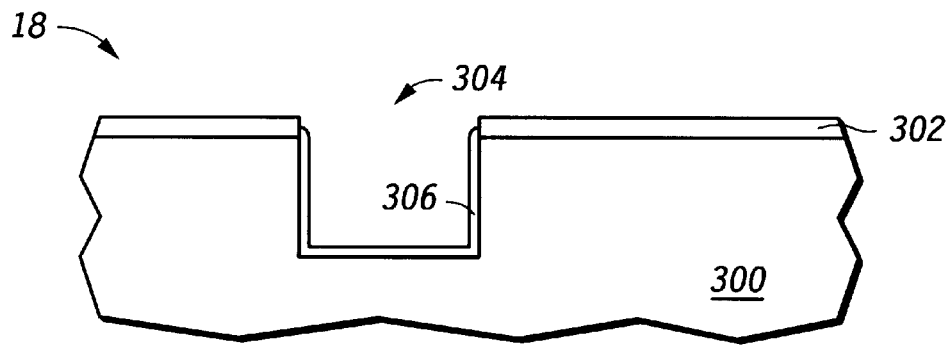
FIGS. 14–17 illustrate, in cross-sectional diagrams, an alternate embodiment which can be used to form trench isolation regions simultaneous to damascene gate electrodes whereby a sub-lithographic MOS device is formed in accordance with the present invention.

FIGS. 14–17 illustrate an alternate embodiment of the present invention wherein a sub-lithographic MOS device can be formed having the advantages discussed herein. This sublithographic device is formed using trench isolation and damascene gate electrode processing whereby the polysilicon stringers of FIGS. 1 and 2 are avoided and the number of processing steps needed to form the device is reduced over the prior art process of FIGS. 3 and 4. FIG. 14 illustrates a device 18. Device 18 has a substrate 300 which is similar to the substrates 100 and 200 previously introduced in previous figures. A sacrificial layer 302, such as an oxide, is formed and a trench opening 304 is formed through the layer 302 and the substrate 300. A re-oxidation process is utilized in order to form a liner 306 in FIG. 14.

Figure 15:
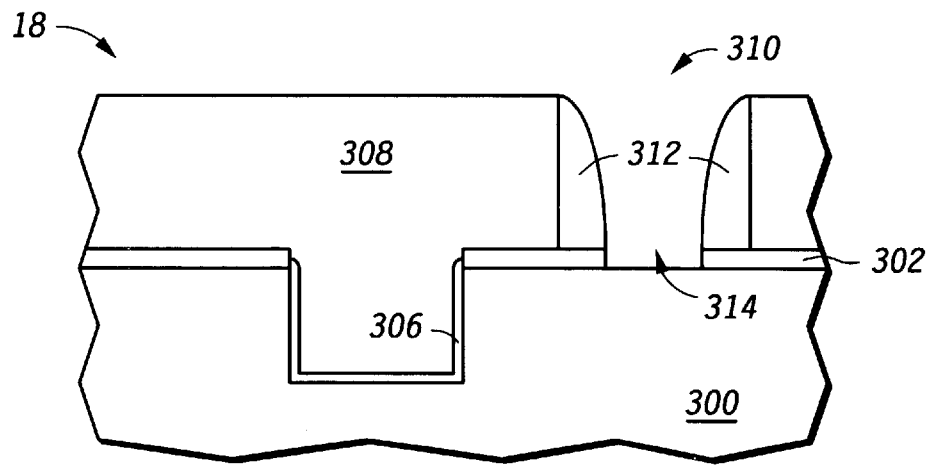

FIG. 15 illustrates a layer 308 which is similar to the layer 208 illustrated in FIGS. 10–12. The layer 308 is polished and lithographically patterned and etched in order to form a planar topped surface and form an opening 310. Silicon nitride spacers 312 are formed wherein these spacers are similar to the nitride spacers 212 discussed with respect to FIG. 11. After formation of the spacers 312, an etch is used to remove the sacrificial layer 302 lying within an inside periphery of the spacer 312. Typically, this is an oxide etch and is performed via a wet or vapor chemistry. Therefore, the opening 310 is deepened into a region 314 whereby a portion of the substrate 300 is exposed in FIG. 15 by the collective opening 310/314.

Figure 16:
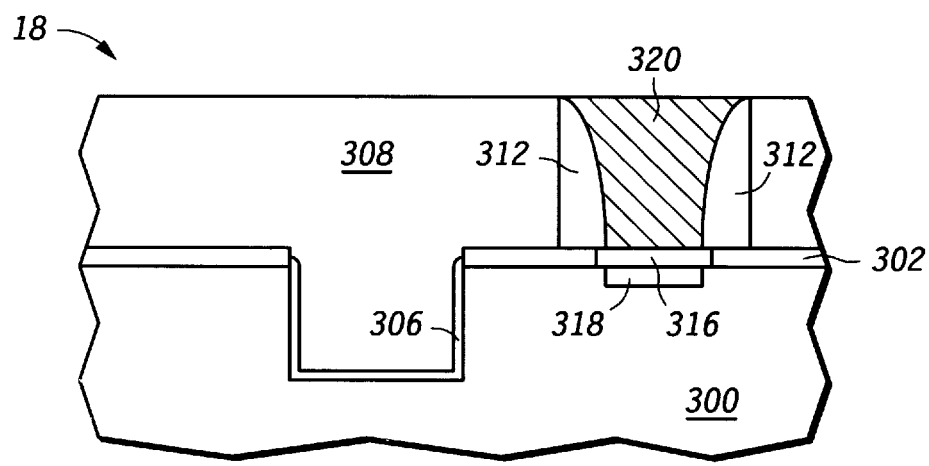

FIG. 16 illustrates that a thermal gate oxide 316 is formed. FIG. 16 also illustrates that punch-through adjust implants and/or threshold voltage (Vt) adjust implants may be performed to form doped regions 318 within the substrate 300. After formation of the gate dielectric 316 and the doped region 318, amorphous and/or polysilicon layers are deposited and polished in order to form the polysilicon gate electrode plug 320 as taught herein above. Due to the presence of the nitride spacers 312, the effective gate width of a bottom gate portion of the region 320 is sub-lithographic in dimension, unlike the lithographically limited dimension of the gate electrode 214/204a in the embodiments of FIGS. 8–13.

Figure 17:
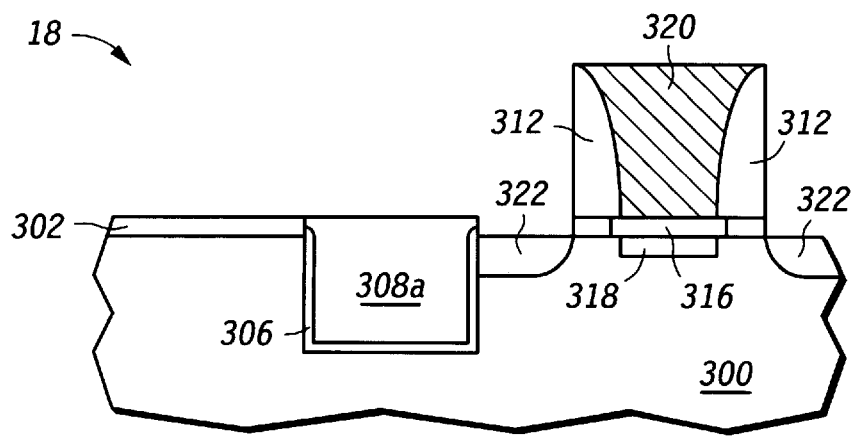

FIG. 17 then illustrates that an oxide etch process is used to remove upper portions of the layer 308 in order to form a trench fill region 308a in FIG. 17. Portions of the sacrificial oxide 302 which are exposed around an outer periphery of the spacer 312 are then etched and removed in order to enable formation of source and drain regions 322 and in order to enable subsequently-formed electrical contacts to these source and drain regions 322.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

What is claimed is:

1. A method for forming a semiconductor structure, the method comprising the steps of:

providing a semiconductor substrate;

forming a gate oxide region;

forming a trench region in the semiconductor substrate after forming the gate oxide region;

filling the trench region with a dielectric material by depositing a dielectric layer as the dielectric material wherein the dielectric layer is: (1) etched to contain an opening which is used to define at least a portion of a gate electrode for the transistor: and (2) used to provide trench fill material for the trench region to form trench isolation structures; and forming a transistor over the gate oxide region wherein the transistor uses the gate oxide region as a gate dielectric.

2. The method of claim 1 further comprising the step of:
etching away the dielectric layer selective to an underlying silicon-containing layer.

3. The method of claim 1, wherein the step of forming the transistor and filling the trench region comprises:
forming nitride spacers within the opening which is used to define at least a portion of the gate electrode.

4. The method of claim 1, wherein the step of forming the transistor and filling the trench region comprises:
forming a first polysilicon layer both under the dielectric layer and above the gate oxide region and a second polysilicon layer over the dielectric layer wherein the first and second polysilicon layers are used to form a gate electrode for the transistor.

5. The method of claim 1, further comprising:
depositing a layer of polysilicon over the gate oxide region to protect the gate oxide region from subsequent processing.

6. The method of claim 5, further comprising:
patterning the layer of polysilicon to form a polysilicon region which remains on the semiconductor structure to function as a portion of a gate electrode for the transistor.

7. The method of claim 1, wherein the step of forming the trench region further comprises:
etching through a portion of the gate oxide region to form the trench region.

8. A method of forming a semiconductor structure, the method comprising the steps of:
providing a semiconductor substrate having an upper surface and an active region of the upper surface;
forming a trench region in the semiconductor substrate, wherein the trench region extends below the upper surface of the semiconductor substrate;
forming a dielectric region over a portion of the semiconductor substrate to fill the trench region and overly the active region of the semiconductor substrate; and
forming a gate opening in the dielectric region over a portion of the active region to define a transistor gate electrode location.

9. The method of claim 8, further comprising the step of:
forming a gate oxide region over the semiconductor substrate from a portion of the substrate which is exposed through opening.

10. The method of claim 9, further comprising the steps of:
forming a spacer within the gate opening prior to the step of forming the gate oxide region; and
implanting a portion of the substrate, which is exposed through the gate opening, to form a doped channel region within the substrate.

11. The method of claim 10, further comprising the step of:
forming a first conductive region within the gate opening subsequent the steps of forming the spacer and implanting a portion of the substrate.

12. The method of claim 11, wherein the step of forming the first conductive region comprises the substeps of:
forming a conductive layer over the trench region and active region; and
planarizing the conductive layer over the gate opening using a polishing process.

13. The method of claim 11, further comprising the steps of:
removing a portion the dielectric region substantially above the upper surface of the semiconductor substrate to leave behind trench fill material within the trench region to provide electrical isolation between transistors.

14. The method of claim 8, further comprising the steps of:
forming a gate oxide region over the semiconductor substrate; and
forming a first conductive region over the gate oxide region prior to forming the trench region.

15. The method of claim 14, further comprising the steps of:
etching an opening through the gate oxide region, the first conductive region, and the semiconductor substrate to form the trench region.

16. The method of claim 14, further comprising the steps of:
removing a portion the dielectric region substantially above the first conductive region; and
removing a first portion the first conductive region, wherein a second portion of the first conductive region within the gate opening remains over the dielectric region.

17. The method of claim 14, further comprising the steps of:
forming a spacer within the gate opening prior to the step of forming the gate oxide region; and
implanting a channel region portion of the substrate through the gate opening.

18. The method of claim 17, further comprising the step of:
forming a first conductive region within the gate opening subsequent both the steps of forming the spacer and implanting the channel region.

19. The method of claim 18, wherein the step of forming the first conductive region comprises the substeps of:
forming a conductive layer over the trench region and active region; and
planarizing the conductive layer over the gate opening to form a conductive plug region in the gate opening which functions as a portion of a gate electrode of the transistor.

20. The method of claim 19, further comprising the steps of:
removing a portion the dielectric region substantially above the upper surface of the semiconductor substrate so that a portion of the dielectric region is left behind to form trench fill material within the trench region.

21. A method for forming a semiconductor structure, the method comprising the steps of:
providing a semiconductor substrate;
forming a dielectric region having a recessed region;
forming an opening in the dielectric region;
forming a conductive region over the dielectric region;
polishing, with a first polishing environment, the conductive region to form a conductive plug within the opening and a conductive defect in the recessed region;
changing the first polishing environment to a second polishing environment to remove an upper portion of the dielectric region adjacent to the conductive defect to further expose the conductive defect; and changing the second polishing environment to a third polishing environment to remove substantially all of the conductive defect.

22. A method of forming a semiconductor structure, the method comprising the steps of:

providing a semiconductor substrate;

forming an oxide layer over the semiconductor substrate;

forming a first conductive layer over the oxide layer;

forming a first opening into the semiconductor through the oxide layer and the first conductive layer;

forming a dielectric to fill the first opening and overlie the first conductive layer;

forming a second opening in the dielectric layer over an active area of the semiconductor substrate to expose a portion of the first conductive layer;

forming a spacer within the second opening;

forming a second conductive layer to fill remaining portions of the second opening;

polishing the second conductive layer to remove substantially all of the second conductive layer positioned outside the second opening;

removing a portion of the dielectric layer positioned outside the first opening to form a dielectric fill region in the first opening whereby trench isolation is formed; and removing a portion of the first conductive layer that is exposed by the step of removing a portion of the dielectric layer.

23. The method of claim 22, further comprising the steps of:

implanting the semiconductor substrate with dopant atoms through the second opening before the step of forming the second conductive layer.

* * * * *